United States Patent [19]

Streifer et al.

[11] 4,006,432
[45] Feb. 1, 1977

[54] INTEGRATED GRATING OUTPUT COUPLER IN DIODE LASERS

[75] Inventors: William Streifer, Palo Alto; Donald R. Scifres, Los Altos; Robert D. Burnham, Los Altos Hills, all of Calif.

[73] Assignee: Xerox Corporation, Stamford, Conn.

[22] Filed: Oct. 15, 1974

[21] Appl. No.: 515,120

[52] U.S. Cl. .................... 331/94.5 C; 331/94.5 H; 357/16; 357/18
[51] Int. Cl.$^2$ .................... H01S 3/19; H01S 3/081
[58] Field of Search ................ 331/94.5 C, 94.5 H; 357/16, 18

[56] References Cited

UNITED STATES PATENTS

| 3,758,875 | 9/1973 | Hayashi | 331/94.5 H |
| 3,898,585 | 8/1975 | Heidrich et al. | 350/96 WG |

OTHER PUBLICATIONS

Kazarinov et al., "Injection Heterojunction Laser ... ", Soviet Physics—Semiconductor, vol. 6, No. 7, Jan. 1973, pp. 1184–1189.
Shank et al., "Double—heterostructure ... Distributed Feedback Laser," Applied Physics Letters, vol. 25, No. 4, Aug. 15, 1974, pp. 200–201.
Nakamura et al., "GaAs–GaAlAs Lasers with a Corrugated Interface," Optics Communications, vol. 11, No. 1, May 1974, pp. 18–19.
Harris et al., "Distributed Feedback Semiconductor Injection Laser," IBM Tech. Discl. Bulletin, vol. 16, No. 1, June 1973, pp. 171–172.

Primary Examiner—William D. Larkins
Attorney, Agent, or Firm—J. E. Beck; T. J. Anderson; L. Zalman

[57] ABSTRACT

A heterojunction diode laser which produces a highly collimated, polarized light beam perpendicular to the plane of the PN junction of the laser rather than through cleaved end faces in the plane of the PN junction. The diode laser includes a periodic structure which is buried at a heterojunction interface and in contact with a light waveguide layer. The periodic structure acts to produce the feedback necessary for lasing. If the spacing of the teeth of the periodic structure are an integer number of wavelengths of the light photons produced in the laser, the light beam exits at an angle perpendicular to the plane of the PN junction. If a tooth spacing is chosen that is not equal to an integer number of wavelengths of the light photons produced in the laser, the light beam may emerge from the diode at an angle other than the normal with the specific angle determined by the particular tooth spacing. To increase output intensity, the ends of the laser perpendicular to the plane of the PN junction and parallel to the teeth of the periodic structure may be cleaved and coated with a highly light reflective film.

2 Claims, 4 Drawing Figures

INTEGRATED GRATING OUTPUT COUPLER IN DIODE LASERS

BACKGROUND OF THE INVENTION

Recently, interest has been focused on diode lasers as a possible light source for integrated optical circuits. When the PN junction of these devices is forward-biased, charge carriers of one type are injected across the PN junction to a waveguide region which has a predominance of charged carriers of the opposite conductivity type, with recombination of the carriers producing light. Feedback of light necessary to produce lasing is achieved by cleaved end-faces and/or external mirrors with one or both of the external mirrors being about 70% transmissive so that the output light beam can be transmitted.

In conventional diode lasers, of the type described, especially single hereojunction and double heterojunction diode lasers, the light waveguide layer of the device is extremely thin (approximately 1.5 microns) and laser oscillations occur across filamentary areas on the order of only 10 microns wide. As a result, the laser output light beam eminates from virtually a "slit" source at an edge of the waveguide layer and the divergence of the output beam is large since the beam divergence is inversely proportional to the size of the slit aperature. Typical beam divergences are 10° in one direction and possibly 30°–40° in the other direction. Also, the laser output beam obtained via transmission through cleaved end faces often has a random polarization. These two factors, i.e., large divergence angle and randomness of polarization, has stimulated interest in lasers in which the output light beam is emitted normal to, or substantially normal to, the plane of the waveguide layer of a laser as discussed in an article appearing in Applied Physics Letters, Vol. 25, No. 4, Aug. 1974 and entitled "Selectively Etched Diffraction Gratings in GaAs", and in an article appearing in Soviet Physics-Semiconductors, Vol. 6, No. 7, page 1184 (1973) entitled "Injection Heterojunction Laser With A Diffraction Grating On Its Contact Surface".

OBJECTS OF THE INVENTION

It is an object of the invention to produce an improved diode laser.

It is a further object of the present invention to provide an improved diode laser that emits an output beam at an angle to the waveguide plane of the laser.

It is a still further object of the present invention to provide a diode laser in which the output light beam is substantially polarized.

It is a still further object of the present invention to provide a diode laser with a low divergence output beam whose direction can be controlled by fabricating gratings with different teeth spacings.

SUMMARY OF THE INVENTION

In accordance with the invention, the foregoing objects are achieved by a heterojunction diode laser in which a periodic structure is buried in the laser at a heterojunction interface and in contact with the light waveguide layer of the diode. The spacing of the teeth of the periodic structure is selected so that the light rays scattered from the individual teeth or grooves of the periodic structure are in phase along a selected plane wavefront. In the case where the output beam is to be emitted perpendicular to the light waveguide layer of the laser, the teeth of the periodic structure are separated by an integer number of wavelengths of the output light beam divided by the refractive index of the waveguide material, i.e., the light wavelength in the waveguide layer. If a tooth separation is chosen that it is not equal to an integer number of wavelengths of light in the waveguide, the output beam emerges from the diode at any angle to the waveguide laser with the angle determined by the particular tooth separation. The faces of the light waveguide layer parallel to the teeth or grooves of the periodic structure can be cleaved and coated with a non-electrically conducting, highly light reflecting material so that output intensity is increased.

DETAILED DESCRIPTION OF THE INVENTION

Although the invention is applicable to diode lasers in general, it is particularly applicable to single heterojunction and double heterojunction diode lasers and particularly to electrically pumped diode lasers. Accordingly, the invention will be described in conjunction with an electrically pumped, single heterojunction diode laser with applicability to other types of electrically pumped heterojunction lasers being intended.

Figure 1:
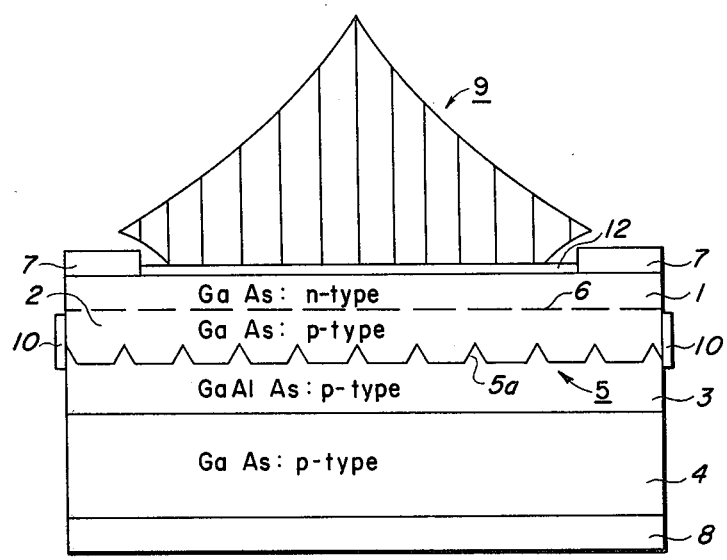
FIG. 1 is a cross-sectional view of a diode laser in accordance with the invention.

Referring now to FIG. 1, there is shown an electrically pumped, single heterojunction diode laser in accordance with the invention. Basically, the device of FIG. 1 consists of an N-type gallium arsenide layer 1, a P-type gallium arsenide layer 2, a P-type gallium aluminum arsenide layer 3, and a P-type gallium arsenide layer 4. A periodic structure 5, shown in the form of a grating having upwardly extending teeth or grooves 5a, exists between layers 2 and 3. The periodic structure 5 is produced on a surface of an N-type gallium arsenide substrate (the bulk material of which at that time included the bulk material of layers 1 and 2, as will be described hereinafter) by a conventional method, such as interferometric exposure of a photoresist followed by development and ion milling, prior to layer 3 being grown. After growth of layers 3 and 4, the device is placed in a diffusion chamber and a diffusion of the P-type dopent of layer 3 is achieved to produce layer 2 and the PN junction 6 between layers 1 and 2. Metallic contacts 7 and 8 are affixed to layers 1 and 4, respectively, to enable electrical pumping of the diode laser. Contact 7 can be comprised of two bar-shaped members as shown.

Following electrical pumping, light is generated and confined to layer 2 due to the lower refractive indicies of the adjacent layers 1 and 3. The periodic structure 5 couples and reinforces right and left light waves traveling through the layer 2 such that there is sufficient feedback to produce lasing. As a result of scattering of the rays of the lasing beam by the teeth 5a of the periodic structure 5, the laser output beam, shown symbolically as 9 in FIG. 1, exits the laser through the top surface of the laser not through the edges of the waveguide layer 2 as does the heterojunction diode laser described in copending U.S. patent application Ser. No. 499,671, filed Aug. 22, 1974 and entitled "Electrically Pumped, Solid-State Distributed Feedback Laser". The angle that beam 9 makes to the plane of PN junction 6 (and the plane of region 2) is determined by the particular spacing between the teeth 5a of periodic structure 5. If the spacing between teeth 5a is an integer number of wavelengths of the light photons produced in region 2, the light beam 9 exits at an angle perpendicular to PN junction 6. If a tooth spacing is chosen that is not equal to an integer number of wavelengths of the light photons in region 2, then the beam 9 will have an angle to the plane of PN junction 6 which is other than the normal with the specific angle determined by the particular tooth spacing.

In order to increase the intensity of lasing, by limiting the light escaping from the edges of the region 2, the external surfaces of the layer 2 parallel to teeth or grooves 5a are cleaved, and coated with highly ($>$90%) light reflective films 10. Care should be taken that films 10 do not short circuit PN junction 6. If the films 10 cross junction 6, the films 10 must be electrical insulators, or have such a high resistance that they act as electrical insulators. To reduce the amount of reflection of beam 9 at the top of layer 1, an anti-reflection coating 12, such as zirconium dioxide, may be applied to the top surface of layer 1.

Figure 2:
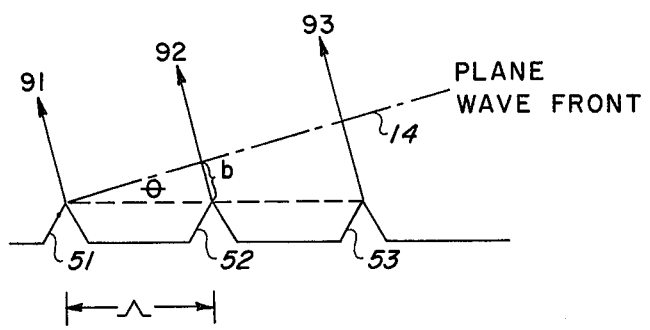
FIG. 2 is an exploded view of a portion of one periodic structure of the laser of FIG. 1.

The action of periodic structure 5 in the production of output beam 9 is explained in conjunction with FIG. 2 which shows a magnified view of a portion of the periodic structure 5 having a spacing between teeth of $\Lambda$. Only a wave traveling to the right is considered and it is assumed that the desired light output is to impinge upon a planar surface parallel to the plane wavefront 14, as shown. From geometric optics, the rays scattered from successive teeth are in phase if (say) ray 91 scattered from tooth 51 is in phase with ray 92 scattered from tooth 52, and ray 93 scattered from tooth 53. For rays 91 and 92 to be in phase, the additional distance travelled by ray 92 before it gets to wavefront 14 must be an integral multiple of a wavelength of the light in the material of layer 2 which is $\lambda_o/n$ where $\lambda_o$ is the free space wavelength of the laser output and $n$ is the refractive index of layer 2. Expressed mathematically, in reference to FIG. 2, ray 91 and ray 92 are in phase if $$b + \Lambda = m (\lambda_o/n) \quad (1)$$

were $n$ and $\lambda_o$ are noted, $m$ is an integer relating to the mode propagated, and $b$ is the distance shown in FIG. 2. Since from FIG. 2

$$b = \Lambda \sin \theta \quad (2)$$

equation (1) and equation (2) yield $$\sin \theta = \frac{m\lambda_o}{n\Lambda} - 1 \quad (3)$$

For the angle $\theta$ to be real, the magnitude of the right side of equation (3) cannot exceed unity. Depending on $\Lambda$ the angle of beam propagation can be varied since $n$, $m$ and $\lambda_o$ are physical constants. Taking, for example, the case where the light beam is to be emitted perpendicular to the plane of the P-N junction 6, then $b$ of equation (1) would be zero and $\Lambda = m (\lambda_o/n)$, which means that the spacing between teeth 5a is equal to the wavelength of the light in layer 2, and equation (3) yields $$\sin \theta = m - 1 \quad (4)$$

with solutions existing for $m = 0$, 1 and 2. The $m = 0$ solution and the $m = 2$ solution yield $\sin \theta = -90°$ and $\sin \theta = +90°$, respectively, and describe light scattered to the right and to the left, respectively, along the plane of P-N junction 6. For $m = 1$, $\theta = 0$, and the wavefront 14 is parallel to the P-N junction 6 and the rays 91, 92 and 93 are perpendicular to junction 6 and waveguide layer 2. A left going light wave will also produce an output beam which reinforces the output beam generated by the right going wave. Although only one output beam 9 is shown as exiting through layer 1 via coating 12, a similar output beam is produced which would exit through layer 4 if it were not for the metallic contact 8. Thus, it is shown that when the spacing between the teeth of a periodic structure within the diode is equal to the wavelength of the light within the diode, or an integral number of such wavelengths, an output light beam perpendicular to the plane of the P-N junction within the diode laser is achieved. Where the output light beam is to be at an angle other than the normal, the spacing between the teeth of the periodic structure is adjusted such that the additional distance (distance $b$ of FIG. 2) that rays of light scattered by the periodic structure must travel to reach a designated plane wavefront when added to the spacing between teeth equal an integer number of wavelengths of the light produced in the laser.

Referring again to FIG. 1, the device of FIG. 1 was tested with layer 1 having a doping level of about $10^{18} cm^{-3}$ and being about 50 microns thick, layer 2 having a doping level of about $2 \times 10^{18} cm^{-3}$ and being about 1.5 microns thick, and layer 3 being $Ga_{0.4}Al_{0.6}As$ and being about 5 microns thick with the spacing between the teeth of the periodic structure being 4693 A (which is equal to $2\lambda_o/n$). The laser wavelength $\lambda_o$ was tested to be 8480 A. Lasing was achieved while the device was pumped with 0.5 microsecond pulses of 4 amps at 77° K with a repetition rate of 300 Hz. Laser threshold current densities were approximately 1.2 $KA/cm^2$ for a typical device 750 $\mu m \times 330 \mu m$.

Figure 3:
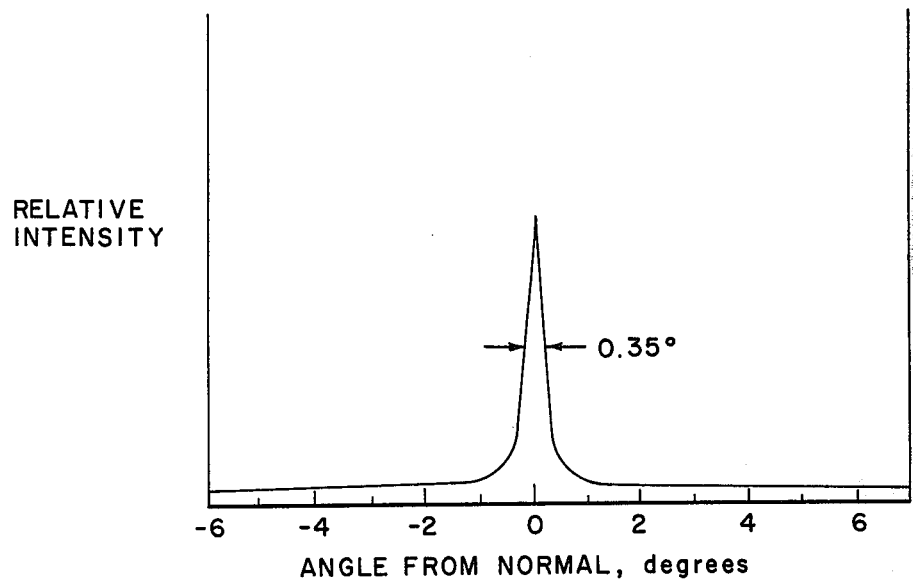
FIG. 3 is an angular scan of the far field radiation pattern in the direction perpendicular to the grooves of the periodic structure of the laser of FIG. 1.

A scan of the far field pattern obtained by angularly rotating a light pipe connected to a photomultiplier about an axis centered on the diode is shown in FIG. 3. A 500 $\mu m$ slit which gave an angular resolution of about 0.1° was employed before the light pipe. At a current of 7.2 A which is approximately 1.7 times threshold the bandwidth of the laser emission was 7 A. The divergence of the beam in the direction determined by the grating along the length of the diode was measured to be only 0.35°, which is a very small angular divergence. The polarization of the output beam was also measured and found to be 100% polarized with the E field parallel to the grating. This high degree of polarization is an advantage which occurs only when the beam propagates perpendicular to the plane of the PN junction 6.

The device of FIG. 1 can be produced by the method described in the aforementioned copending patent application. According to that method, periodic structure 5 would be formed on a surface of layer 1 using conventional interferometric exposure techniques which utilize a beam splitter and two mirrors to direct two laser light beams of equal intensity and equal polarization upon a photoresist with equal angles of incidence. After formation of the periodic structure, P-type gallium aluminum arsenide layer 3 is grown on the periodic structure by conventional liquid phase epitaxy techniques followed by liquid phase epitaxy growth of P-type gallium arsenide layer 4. Next, the device is placed in a diffusion ampoule and heated to drive diffusable p-type dopent from layer 3 into layer 1 to form layer 2 and P-N junction 6. The opposite faces of the semiconductor device parallel to the teeth of the periodic structure are then terminated with cleaves along the (110) plane, which are then coated with films 10 which are highly reflective ($>\pi\%$). The film 10 can be formed by applying a thin coat of "LIQUID BRIGHT GOLD", made by Engelhard, East Newark, N. J., and annealing in air at approximately 500° C to produce an electrically non-conducting film of gold approximately 1000 A thick with a light reflectivity of approximately 98%. Other metalloorganic compounds may be used in lieu of "LIQUID BRIGHT GOLD", i.e., "Platinum Bright" or "Palladium Bright" also made by Engelhard may be used. Suitable reflective films such as gold, silver, platinum or palladium may be vacuum deposited on the cleaved surface at the end of the guiding layer to form films 10. Next the electrodes 7, each of which can be a bar about 65 microns wide for a 750 $\mu$m $\times$ 330 $\mu$m diode, are alloyed to layer 1 leaving a clear surface emitting area of approximately two-thirds of the diode. To complete construction, layer 4 is bound to metallic contact 8 with the electrical pumping pulses being applied between the bars 7 and the contact 8.

Figure 4:
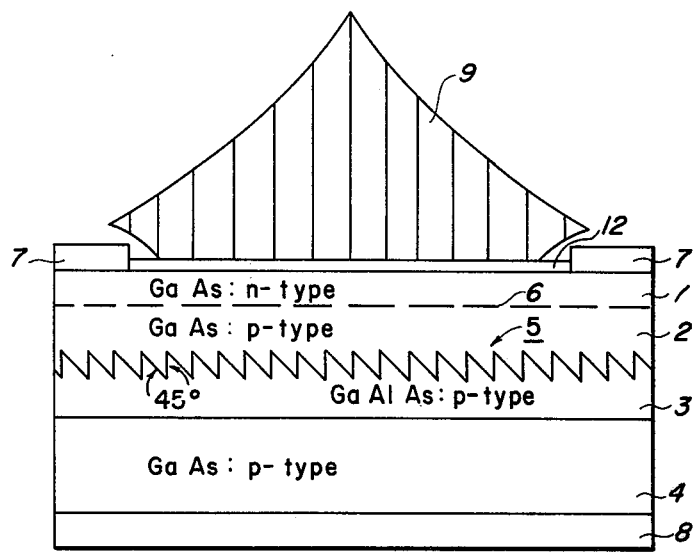
FIG. 4 is a cross-sectional view of a portion of a periodic structure that can be used in the device of FIG. 1.

To reduce absorption of light by layer 1, layer 1 is kept thin, approximately 10 microns thick. Diode output efficiency can also be improved by having a blazed grating, i.e., a grating with triangular teeth which make a 45° angle with the plane of PN junction 6, as shown in FIG. 4. It is noted that grating 5 is buried at a heterojunction interface and in contact with the waveguide layer 2 not at one of the outer faces of the laser. The buried grating results in efficient output coupling which would not occur if the grating were removed from close proximity to the waveguide layer. Further, the heterojunction serves to confine both current and light and makes lower threshold laser operation possible.

We claim:

1. An electrically pumped, distributed feedback, diode laser comprising:
 a solid state body including a plurality of contiguous layers, a first of said layers and a second of said layers providing a heterojunction, said first layer being an active region layer and having a higher index of refraction than said second layer,
 a rectifying junction within said body, carriers injected under forward bias across said junction undergoing radiative recombination in said first layer to generate stimulated coherent radiation,
 a periodic structure within said body, said periodic structure being disposed in said body such that said periodic structure interacts with at least a portion of said stimulated coherent radiation to cause said portion of said stimulated coherent radiation to be reflected by said periodic structure, said periodic structure having a period equal to an integer number of wavelengths of said coherent radiation such that said reflections are in phase and a portion of said coherent light exits said laser at an angle to the plane of said rectifying junction, and
 substantially 100% light reflecting means on sides of said active region layer perpendicular to said rectifying junction and non-light reflecting means on a surface of said body parallel to said rectifying junction.

2. An electrically pumped, distributed feedback laser comprising:
 a semiconductor body including a plurality of layers, pairs of said layers providing a plurality of junctions,
 one of said junctions being a rectifying junction, carriers injected under forward bias across said juncton undergoing radiative recombination in one of said layers to generate stimulated coherent radiation,
 one of said junctions being a non-planar heterojunction, said heterojunction providing a periodic perturbation of refractive index therealong, said perturbation interacting with at last a portion of said radiation to cause said radiation to be reflected by said periodic perturbation, said perturbation having a period equal to an integer number of wavelengths of said coherent radiation such that said reflected radiation is in phase and a portion of said coherent light exits said laser body at an angle to the plane of said rectifying junction, and
 substantially 100% light reflecting means on sides of said active region layer perpendicular to said rectifying junction and non-light reflecting means on a surface of said body parallel to said rectifying junction.

* * * * *